United States Patent
Sambongi et al.

(10) Patent No.: US 9,691,802 B2
(45) Date of Patent: Jun. 27, 2017

(54) IMAGE-ACQUISITION DEVICE

(71) Applicant: OLYMPUS CORPORATION, Tokyo (JP)

(72) Inventors: Masao Sambongi, Tokyo (JP); Kosei Tamiya, Tokyo (JP)

(73) Assignee: OLYMPUS CORPORATION, Tokyo (JP)

(*) Notice: Subject to any disclaimer, the term of this patent is extended or adjusted under 35 U.S.C. 154(b) by 0 days.

(21) Appl. No.: 15/044,567

(22) Filed: Feb. 16, 2016

(65) Prior Publication Data
US 2016/0163752 A1 Jun. 9, 2016

Related U.S. Application Data

(63) Continuation of application No. PCT/JP2014/069677, filed on Jul. 25, 2014.

(30) Foreign Application Priority Data

Aug. 20, 2013 (JP) ................. 2013-170473

(51) Int. Cl.
*H01L 27/146* (2006.01)
*H04N 9/04* (2006.01)
(Continued)

(52) U.S. Cl.
CPC ........ *H01L 27/14621* (2013.01); *G02B 5/201* (2013.01); *G02B 27/286* (2013.01);
(Continued)

(58) Field of Classification Search
None
See application file for complete search history.

(56) References Cited

U.S. PATENT DOCUMENTS 7,745,815 B2* 6/2010 Bandara ............ H01L 27/14652
257/14
8,823,838 B2* 9/2014 Goto ...................... G02B 7/346
348/241
(Continued)

FOREIGN PATENT DOCUMENTS

JP 2002-502120 A 1/2002
JP 2010-263158 A 11/2010
(Continued)

OTHER PUBLICATIONS

International Search Report dated Oct. 28, 2014, issued in counterpart Application No. PCT/JP2014/069677, w/ English translation (3 pages).

*Primary Examiner* — James Hannett
(74) *Attorney, Agent, or Firm* — Westerman, Hattori, Daniels & Adrian, LLP

(57) ABSTRACT

Provided is an image-acquisition device including a first image-acquisition surface including a photoelectric conversion film capable of subjecting incident light to photoelectric conversion while transmitting some of the incident light; a second image-acquisition surface including a photoelectric conversion layer that subjects the incident light transmitted by the first image-acquisition surface to photoelectric conversion; and a polarizing filter that is disposed between the two image-acquisition surfaces and that extracts polarization information from the incident light transmitted by the first image-acquisition surface.

21 Claims, 13 Drawing Sheets

(51) Int. Cl.
*G02B 5/20* (2006.01)
*G02B 27/28* (2006.01)
*G06K 9/52* (2006.01)
*G06K 9/62* (2006.01)
*G06T 7/60* (2017.01)

(52) U.S. Cl.
CPC ............ *G06K 9/52* (2013.01); *G06K 9/6201* (2013.01); *G06T 7/60* (2013.01); *H01L 27/14625* (2013.01); *H01L 27/14643* (2013.01); *H01L 27/14645* (2013.01); *H04N 9/045* (2013.01); *H01L 27/14647* (2013.01)

(56) References Cited

U.S. PATENT DOCUMENTS

| | | | | |
|---|---|---|---|---|
| 2007/0052051 | A1* | 3/2007 | Osaka | H01L 31/101 257/440 |
| 2007/0187604 | A1* | 8/2007 | Bandara | H01L 27/14652 250/338.4 |
| 2010/0282945 | A1 | 11/2010 | Yokogawa | |
| 2013/0293871 | A1* | 11/2013 | Gruev | G01J 3/2803 356/73 |

FOREIGN PATENT DOCUMENTS

| | | |
|---|---|---|
| JP | 2012-212978 A | 11/2012 |
| JP | 2013-148505 A | 8/2013 |
| WO | 99/39372 A2 | 8/1999 |

* cited by examiner

IMAGE-ACQUISITION DEVICE

CROSS-REFERENCE TO RELATED APPLICATIONS

This is a continuation of International Application PCT/JP2014/069677, with an international filing date of Jul. 25, 2014, which is hereby incorporated by reference herein in its entirety.

This application is based on Japanese Patent Application No. 2013-170473, filed on Aug. 20, 2013, the contents of which are incorporated herein by reference.

TECHNICAL FIELD

The present invention relates to image-acquisition devices.

BACKGROUND ART

There is a known image-acquisition device including a polarizing component or a color filter disposed at a position corresponding to each pixel to acquire both polarization information and color information (see, for example, Patent Literature PTL 1).

CITATION LIST

Patent Literature

{PTL 1}
Japanese Unexamined Patent Application, Publication No. 2010-263158

SUMMARY OF INVENTION

Technical Problem

The present invention provides an image-acquisition device capable of simultaneously acquiring polarization information and color information without decreasing the resolution of the color information.

Solution to Problem

The present invention provides the following solutions.

An aspect of the present invention is an image-acquisition device including a first image-acquisition surface including a photoelectric conversion film capable of subjecting incident light to photoelectric conversion while transmitting some of the incident light, a second image-acquisition surface including a photoelectric conversion layer that subjects the incident light transmitted by the first image-acquisition surface to photoelectric conversion, and a polarizing filter that is disposed between the two image-acquisition surfaces and that extracts polarization information from the incident light transmitted by the first image-acquisition surface.

DESCRIPTION OF EMBODIMENTS

An image-acquisition device 1 according to a first embodiment of the present invention will be described below with reference to the drawings.

Figure 1:
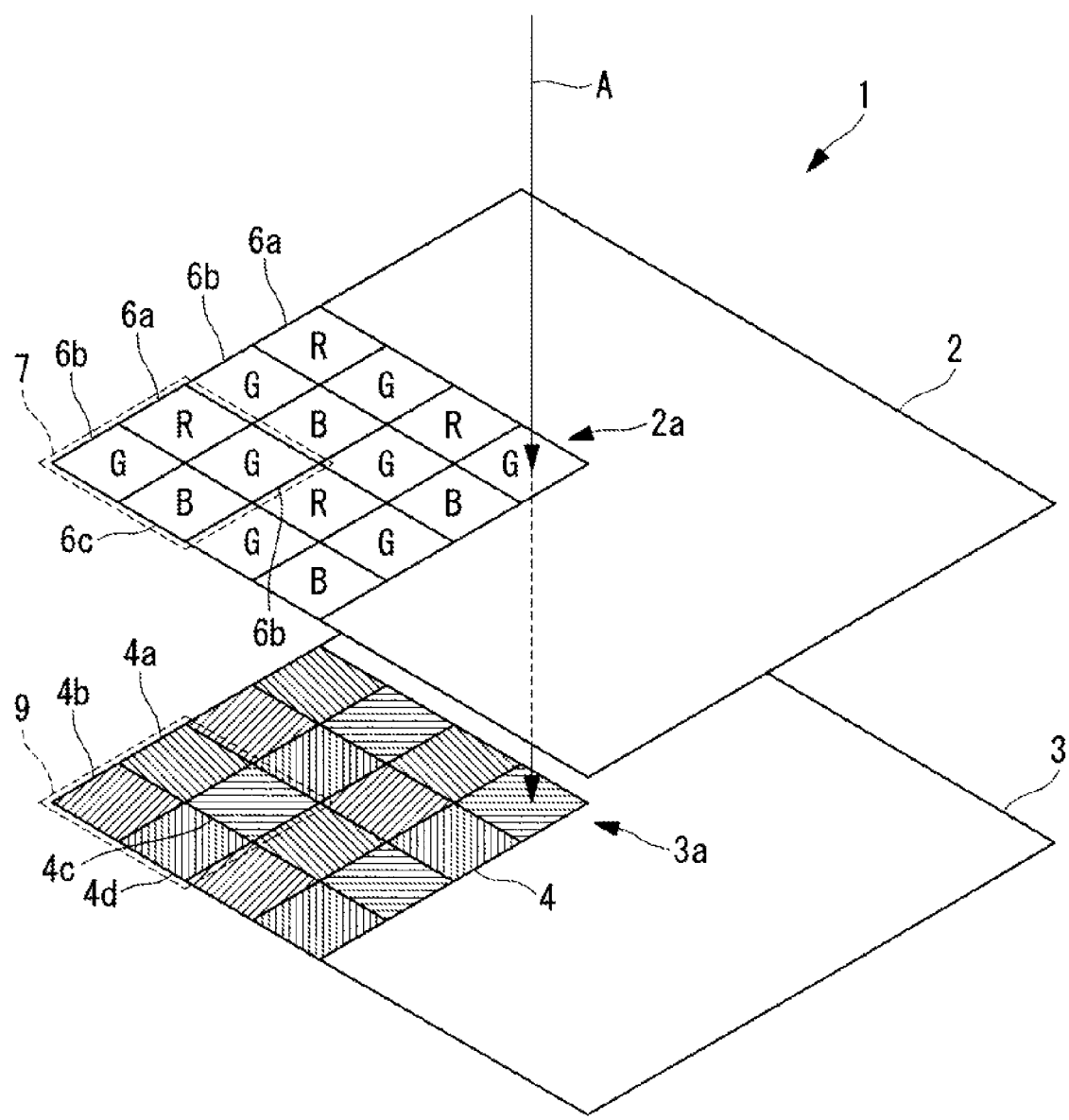
FIG. 1 is a schematic perspective view showing an image-acquisition device according to a first embodiment of the present invention.
Figure 2:
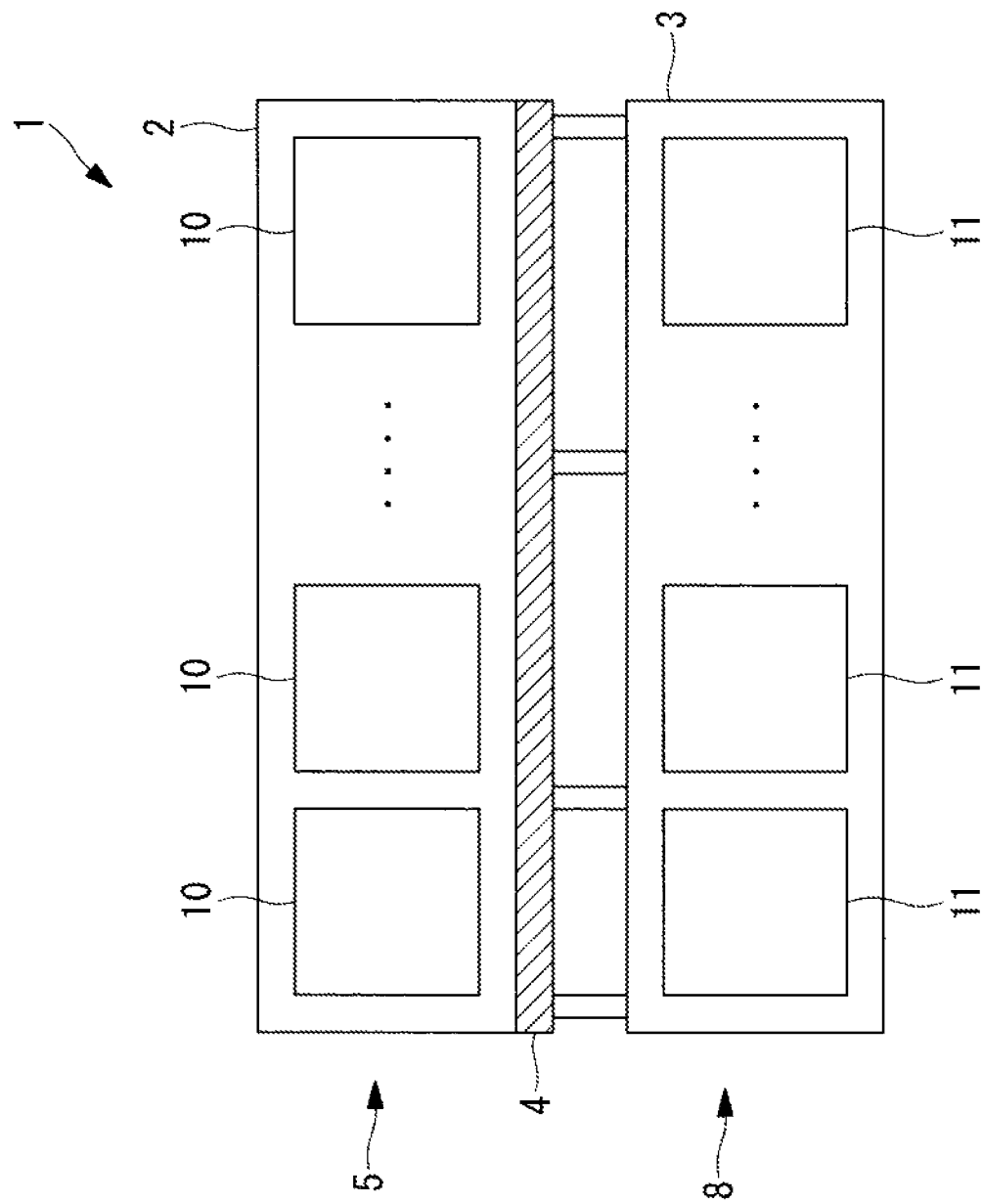
FIG. 2 is a schematic cross-sectional view showing the image-acquisition device in FIG. 1.

As shown in FIGS. 1 and 2, the image-acquisition device 1 according to this embodiment includes two image-acquisition surfaces 2 and 3 arranged in the direction of incidence of incident light A and a polarizing filter 4 disposed between the image-acquisition surfaces 2 and 3.

The first image-acquisition surface 2 includes a photoelectric conversion film 5 (see FIG. 2). The photoelectric conversion film 5 can subject some of the incident light A to photoelectric conversion while transmitting the remaining incident light A. The first image-acquisition surface 2 has a plurality of pixels 2a arranged two-dimensionally. The individual pixels 2a are provided with color filter elements 6a to 6c that have different transmission wavelength ranges and transmit light in particular wavelength ranges.

For instance, the example shown in FIG. 1 includes three types of color filter elements, namely, red (R) filter elements 6a, green (G) filter elements 6b, and blue (B) filter elements 6c, which are arranged in a Bayer pattern. Specifically, the first image-acquisition surface 2 has an array of minimum pixel areas 7, each including a two-by-two array of four pixels 2a provided with one red color filter element 6, two green color filter elements 6b, and one blue color filter element 6c.

The photoelectric conversion film 5 forming the first image-acquisition surface 2 typically has a thickness of 2 to 3 μm and can transmit some of the incident visible light (e.g., green to red light) and near-infrared light.

The second image-acquisition surface 3 has a plurality of pixels 3a arranged two-dimensionally at the same pitch and with the same size as the pixels 2a of the first image-acquisition surface 2. The second image-acquisition surface 3 includes a photoelectric conversion layer 8 that subjects the incident light A to photoelectric conversion.

The polarizing filter 4 is disposed between the first image-acquisition surface 2 and the second image-acquisition surface 3 (shown in the figure as being attached to the second image-acquisition surface 3). The polarizing filter 4 includes four types of polarizing filter elements 4a to 4d having four different polarization directions at positions corresponding to different pixels 3a.

In this embodiment, four different polarizing filter elements 4a to 4d are disposed at the positions corresponding to the four pixels 3a forming each minimum pixel area 9 of the second image-acquisition surface 3. For example, the polarizing filter elements 4a, 4b, 4c, or 4d having the same polarization direction are disposed at the positions corresponding to the color filter elements 6a, 6b, or 6c of the same type.

FIG. 2 is a cross-sectional view of the image-acquisition device 1 according to this embodiment. Photodiodes 10 and 11 are disposed at the positions corresponding to the individual pixels 2a and 3a in the photoelectric conversion film 5 of the first image-acquisition surface 2 and the photoelectric conversion layer 8 of the second image-acquisition surface 3, respectively. The polarizing filter 4 is disposed on the side opposite the light-receiving side of the first image-acquisition surface 2.

The operation of the thus-configured image-acquisition device 1 according to this embodiment will be described below.

To acquire an image of incident light A coming from a subject using the image-acquisition device 1 according to this embodiment, the incident light A coming from the subject is received on the light-receiving side of the first image-acquisition surface 2.

The incident light A first passes through the color filter elements 6a to 6c provided on the first image-acquisition surface 2 of the image-acquisition device 1 and enters the photoelectric conversion film 5 in a wavelength-selected state. Some of the wavelength-selected incident light A is subjected to photoelectric conversion by the photodiodes 10, and the other incident light A passes through the photoelectric conversion film 5.

When the incident light A emerging from the photoelectric conversion film 5 passes through the polarizing filter 4, which is disposed on the side opposite the light-receiving side of the first image-acquisition surface 2, polarization information is extracted from the incident light A. After the polarization information is extracted from the incident light A, it enters the photoelectric conversion layer 8 of the second image-acquisition surface 3, where image signals containing the polarization information are acquired by the photodiodes 11.

Thus, the image-acquisition device 1 according to this embodiment can use all pixels 2a of the first image-acquisition surface 2 to acquire a color image. This is advantageous in that the resolution of the color image is not decreased. In addition, the image signals acquired by the second image-acquisition surface 3 contain polarization information for different polarization directions for different pixels 3a. This is advantageous in that the polarization information for the subject can be acquired with high resolution.

Figure 3:
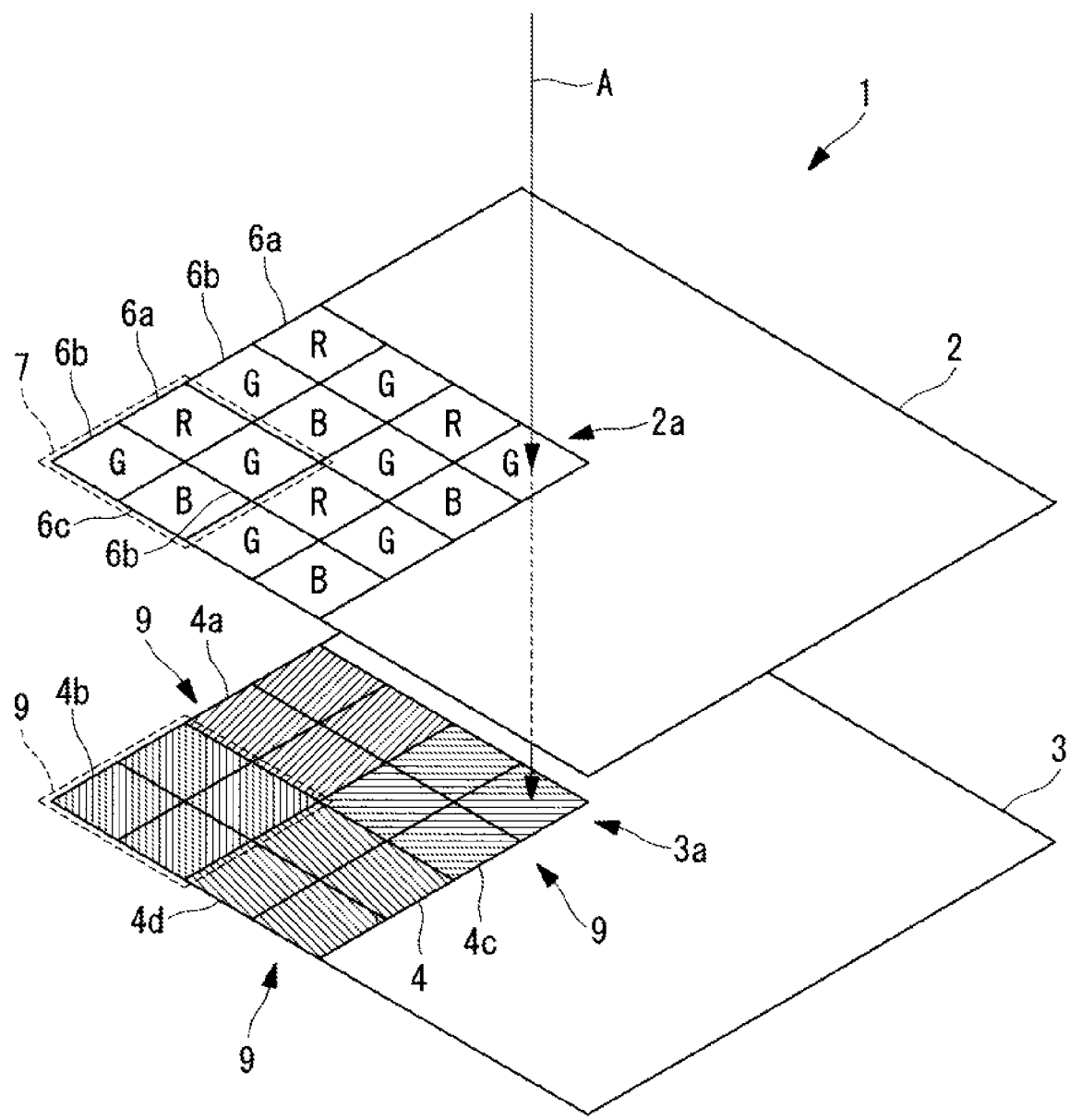
FIG. 3 is a perspective view showing a first modification of the image-acquisition device in FIG. 1.

In this embodiment, the four pixels 3a of each minimum pixel area 9 of the second image-acquisition surface 3 are provided with four polarizing filter elements 4a to 4d having different polarization directions; instead, as shown in FIG. 3, the four pixels 3a of each minimum pixel area 9 may be provided with polarizing filter elements 4a, 4b, 4c, or 4d having the same polarization direction so that the polarization direction of the polarizing filter elements 4a to 4d differs for different minimum pixel areas 9.

If any color is predominant in the subject, for example, if red is predominant, as in biological tissue, most of the image signals acquired by the first image-acquisition surface 2 are red image signals. In this case, most of the incident light A entering the second image-acquisition surface 3 is the incident light A that has passed through the red color filter elements 6a. However, the polarizing filter elements 4a to 4d disposed at the positions corresponding to the red color filter elements 6a have all polarization directions, which is advantageous in that complete polarization information for all polarization directions can be detected even if red is predominant in the subject.

Figure 4:
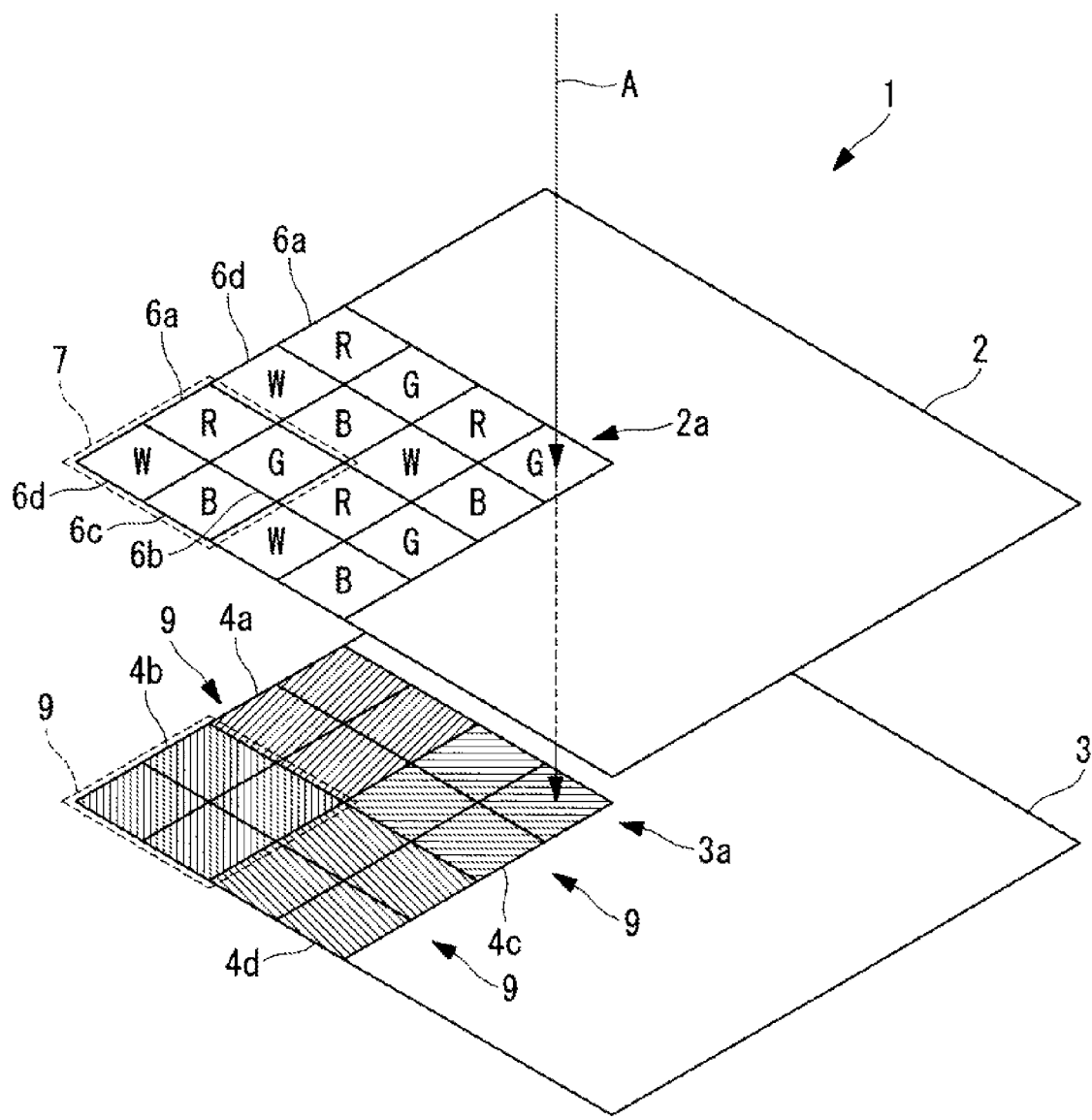
FIG. 4 is a perspective view showing a second modification of the image-acquisition device in FIG. 1.

The image-acquisition device 1 according to this embodiment includes a color filter including a Bayer pattern of only the red color filter elements 6a, the green color filter elements 6b, and the blue color filter elements 6c; instead, as shown in FIG. 4, one of the two green color filter elements 6b in each minimum pixel area 7 may be replaced with a white (W) filter element 6d.

The white color filter elements 6d, which transmit white light, may be made of an optically transparent material or may be empty spaces. This allows more incident light A to be received in the pixels 3a of the second image-acquisition surface 3 located at the positions corresponding to the white color filter elements 6d than in the pixels 3a located at the positions corresponding to the other filter elements 6a to 6c, which is advantageous in that polarization information can be measured with high sensitivity.

Figure 5:
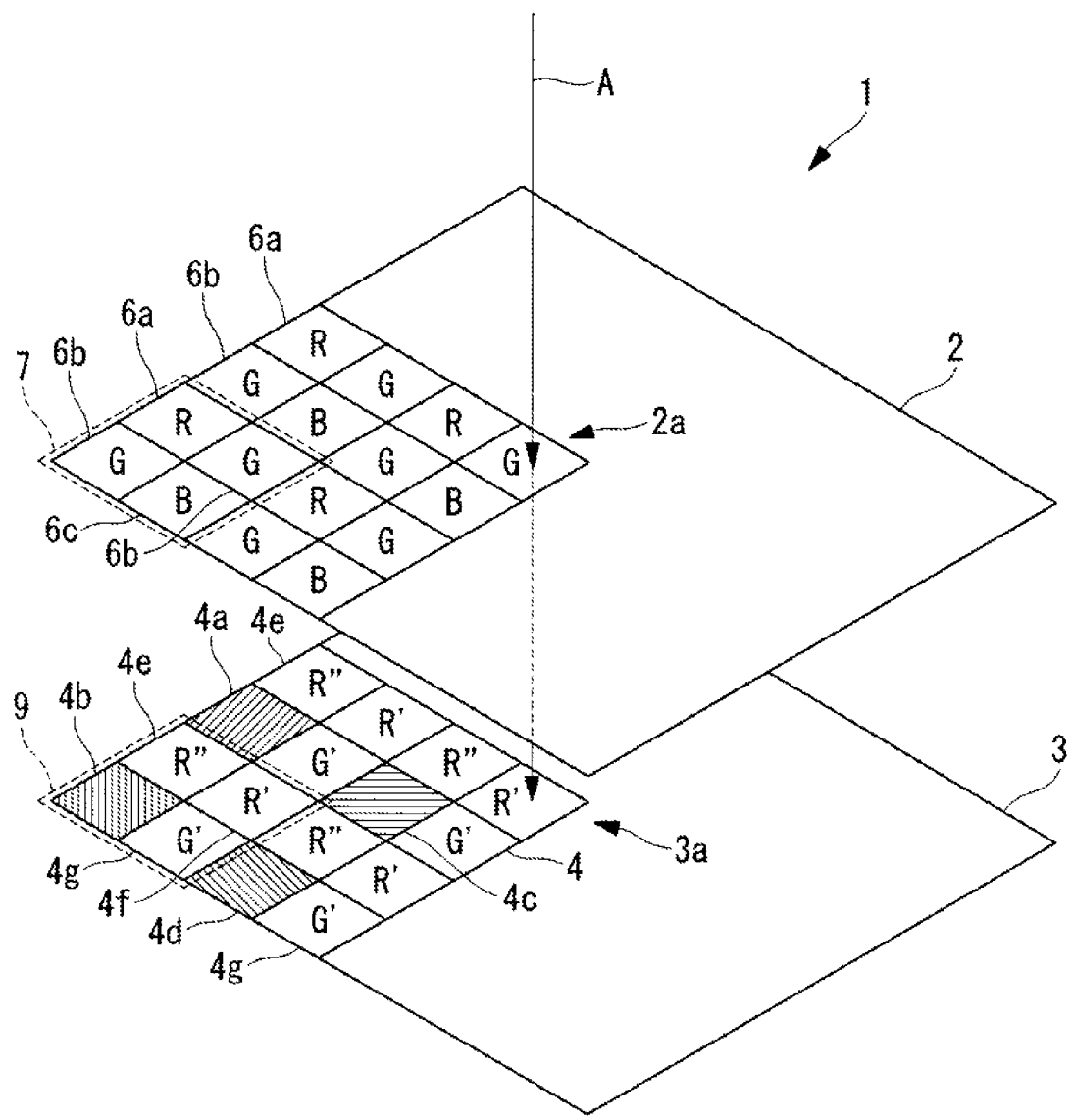
FIG. 5 is a perspective view showing a third modification of the image-acquisition device in FIG. 1.

As shown in FIG. 5, the polarizing filter 4 including only the polarizing filter elements 4a to 4d may be replaced with a polarizing filter 4 including other red color filter elements 4e and 4f disposed at the positions corresponding to the pixels 2a of the first image-acquisition surface 2 corresponding to the red color filter element 6a and one of the green color filter elements 6b and another green color filter element 4g disposed at the position corresponding to the pixel 2a of the first image-acquisition surface 2 corresponding to the blue color filter element 6c.

This allows the detection of color information for the red or near-infrared incident light A passing through the red color filter element 6a of the first image-acquisition surface 2. In this case, the photodiodes 11 of the second image-acquisition surface 3 also have to be sensitive to near-infrared light.

This also allows the detection of color information for the red incident light A, which has a longer wavelength than green light, passing through one of the green color filter element 6b of the first image-acquisition surface 2 and color information for the green incident light A, which has a longer wavelength than blue light, passing through the blue color filter element 6c of the first image-acquisition surface 2.

Thus, color information for red can be acquired at the positions of two of the four pixels 2a forming each minimum pixel area 7, and color information for green can be acquired at the positions of three pixels 2a, which allows red and green image signals to be acquired with high resolution. Near-infrared light can also be detected to perform effective observation of a highly scattering subject such as biological tissue.

Figure 6:
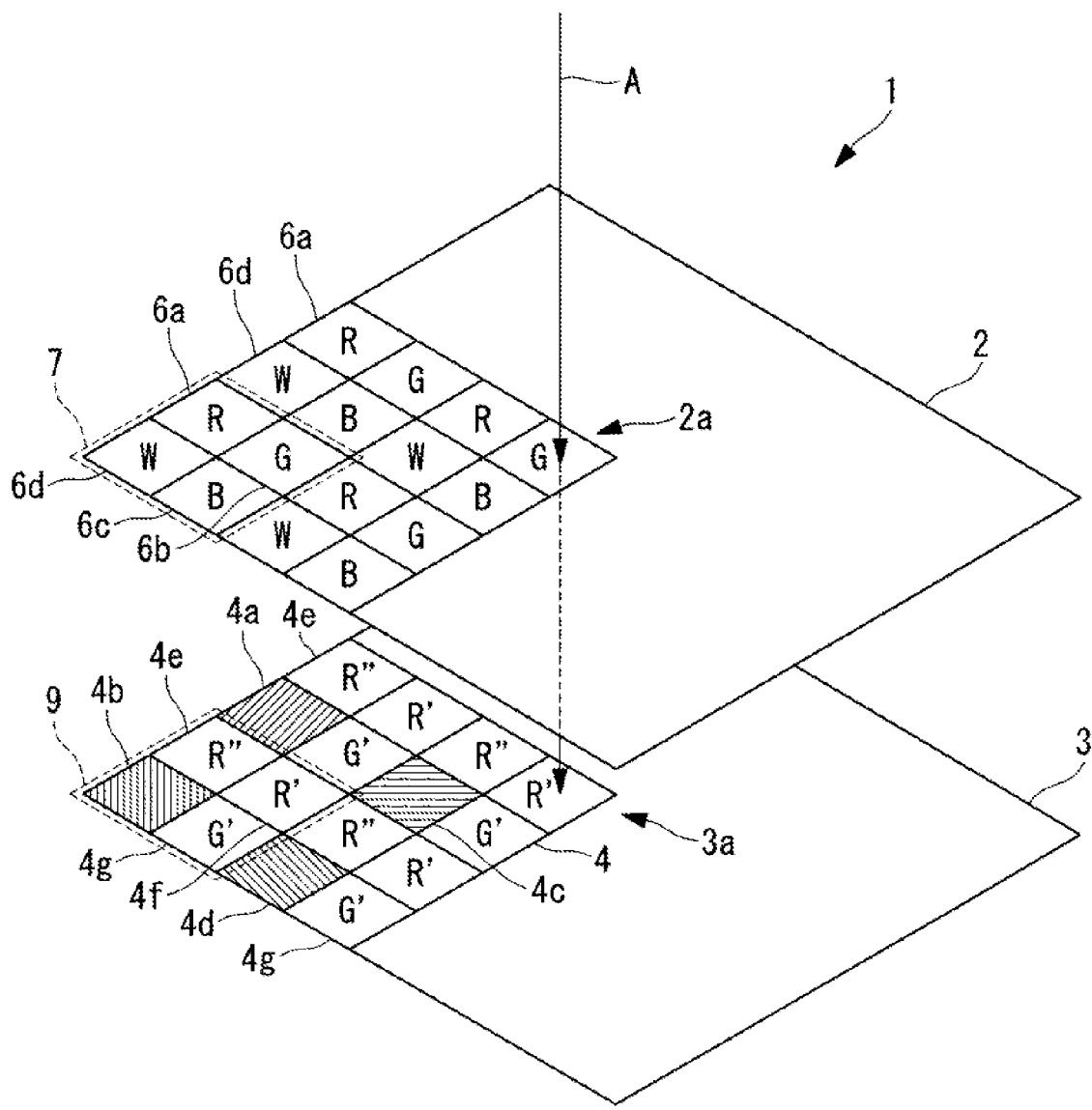
FIG. 6 is a perspective view showing a fourth modification of the image-acquisition device in FIG. 1.

As shown in FIG. 6, of the two green color filter elements 6b in each minimum pixel area 7 in FIG. 5, the green color filter element 6b disposed at the position corresponding to the polarizing filter element 4a, 4b, 4c, or 4d may be replaced with a white color filter element 6d. This maximizes the intensity of the incident light A reaching the polarizing filter elements 4a to 4d, which is advantageous in that polarization information can be measured with high sensitivity.

Figure 7:
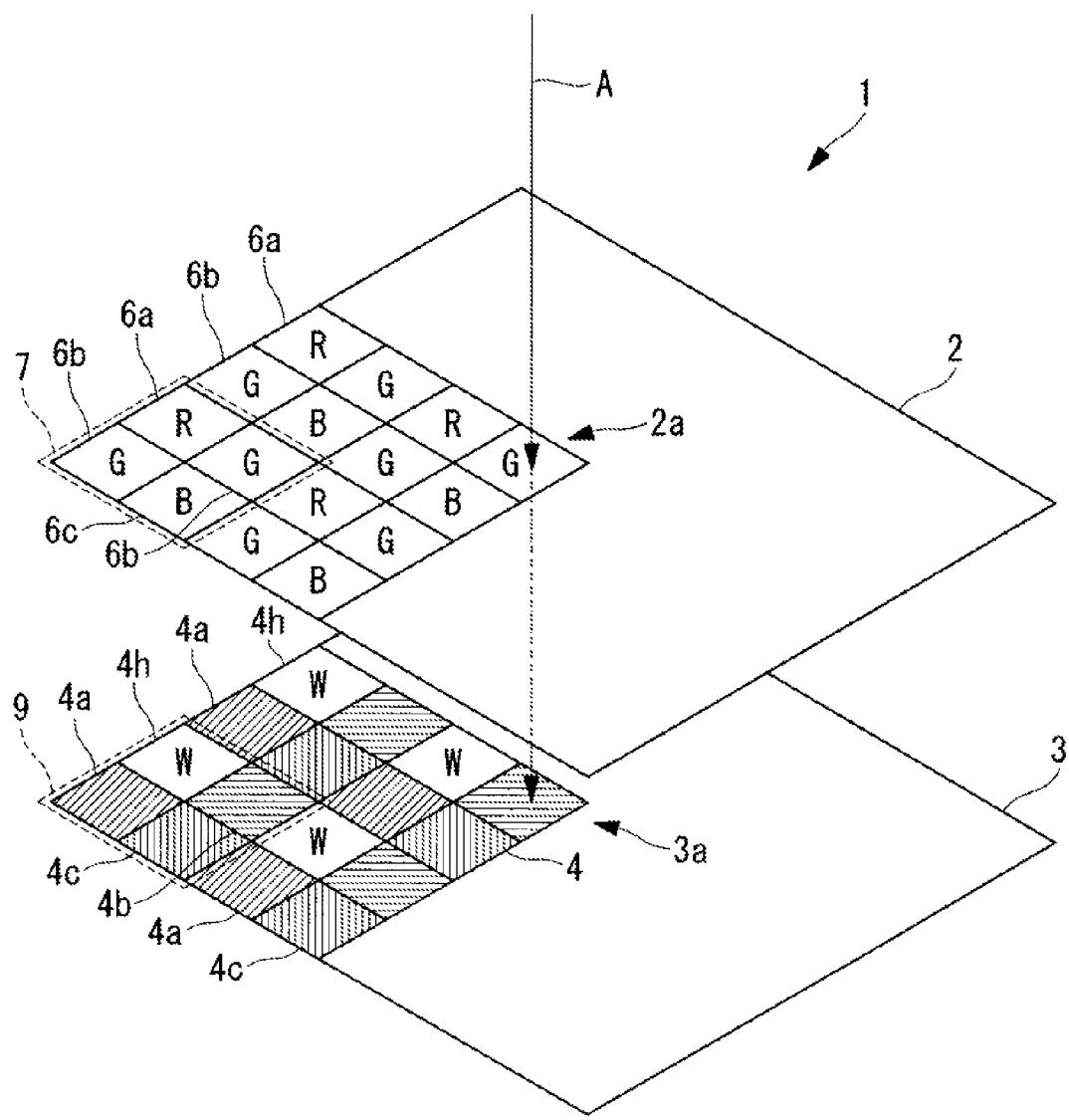
FIG. 7 is a perspective view showing a fifth modification of the image-acquisition device in FIG. 1.

As shown in FIG. 7, the polarizing filter 4 including only the polarizing filter elements 4a to 4d in the image-acquisition device 1 in FIG. 1 may be replaced with a polarizing filter 4 including white color filter elements 4h disposed at the positions corresponding to the pixels 2a corresponding to the red color filter elements 6a. This allows the acquisition of polarization information for three polarization directions and the detection of the near-infrared light passing through the red color filter elements 6a of the first image-acquisition surface 2 in the second image-acquisition surface 3.

Figure 8:
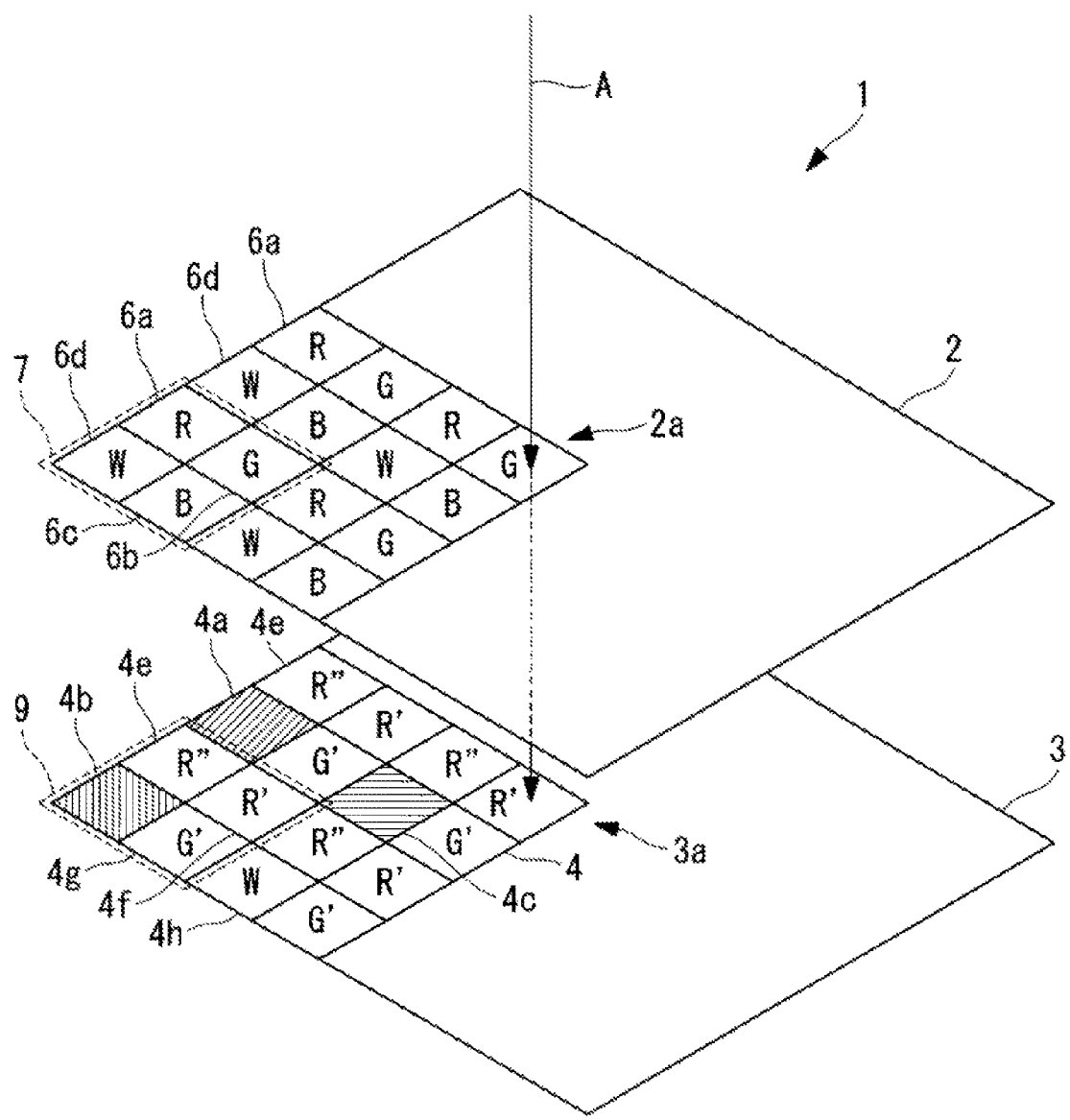
FIG. 8 is a perspective view showing a sixth modification of the image-acquisition device in FIG. 1.

As shown in FIG. 8, of the polarizing filter elements 4a to 4d in the image-acquisition device 1 in FIG. 6, the polarizing filter elements 4d may be replaced with white color filter elements 4h. This allows the detection of the near-infrared light passing through the white color filter elements 4h in the second image-acquisition surface 3.

Figure 9:
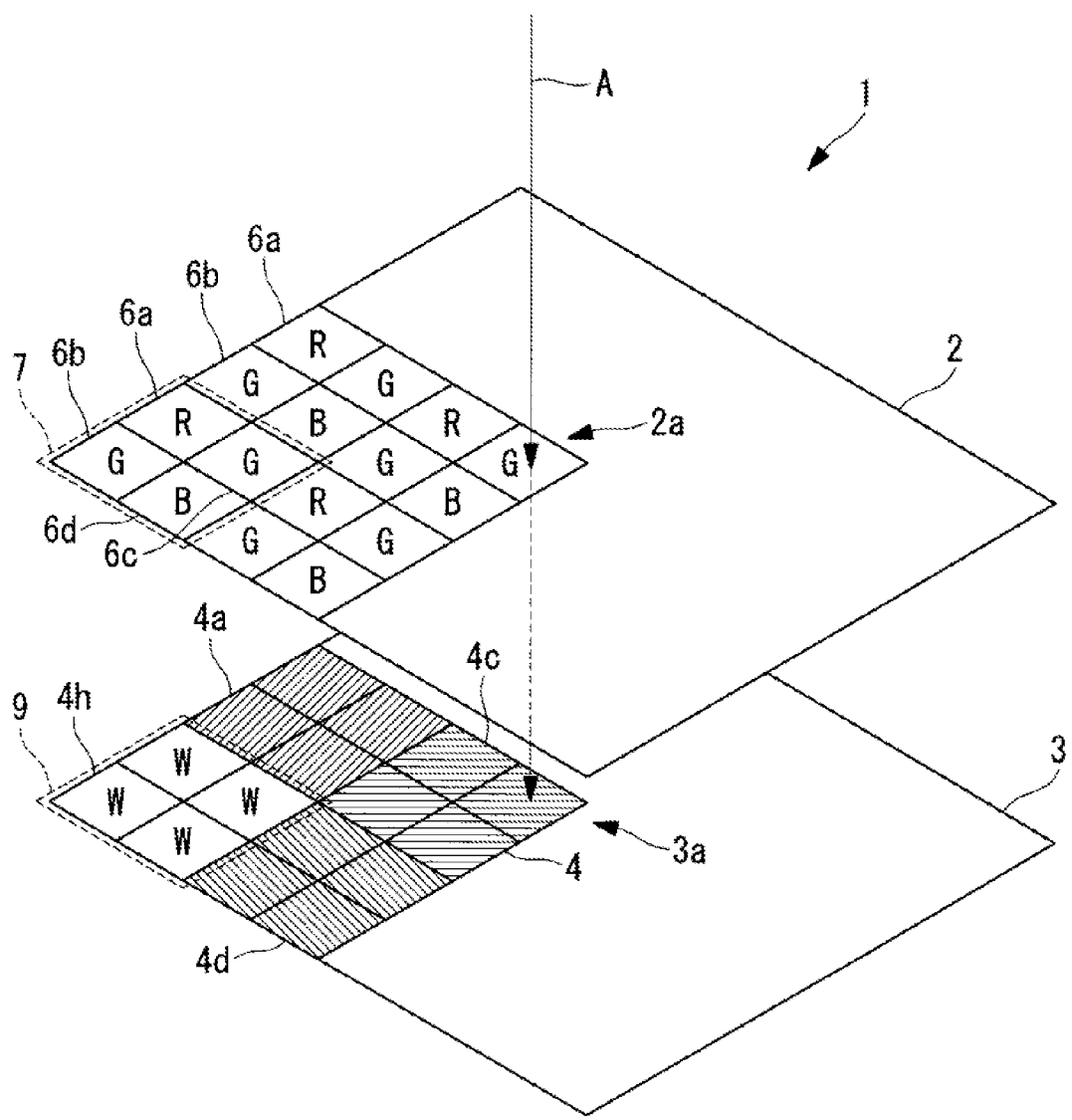
FIG. 9 is a perspective view showing a seventh modification of the image-acquisition device in FIG. 1.

As shown in FIG. 9, of the four types of polarizing filter elements 4a to 4d in the image-acquisition device 1 in FIG. 3, the polarizing filter elements 4b may be replaced with white color filter elements 4h. This allows the detection of the near-infrared light passing through the white color filter elements 4h in the second image-acquisition surface 3.

Figure 10:
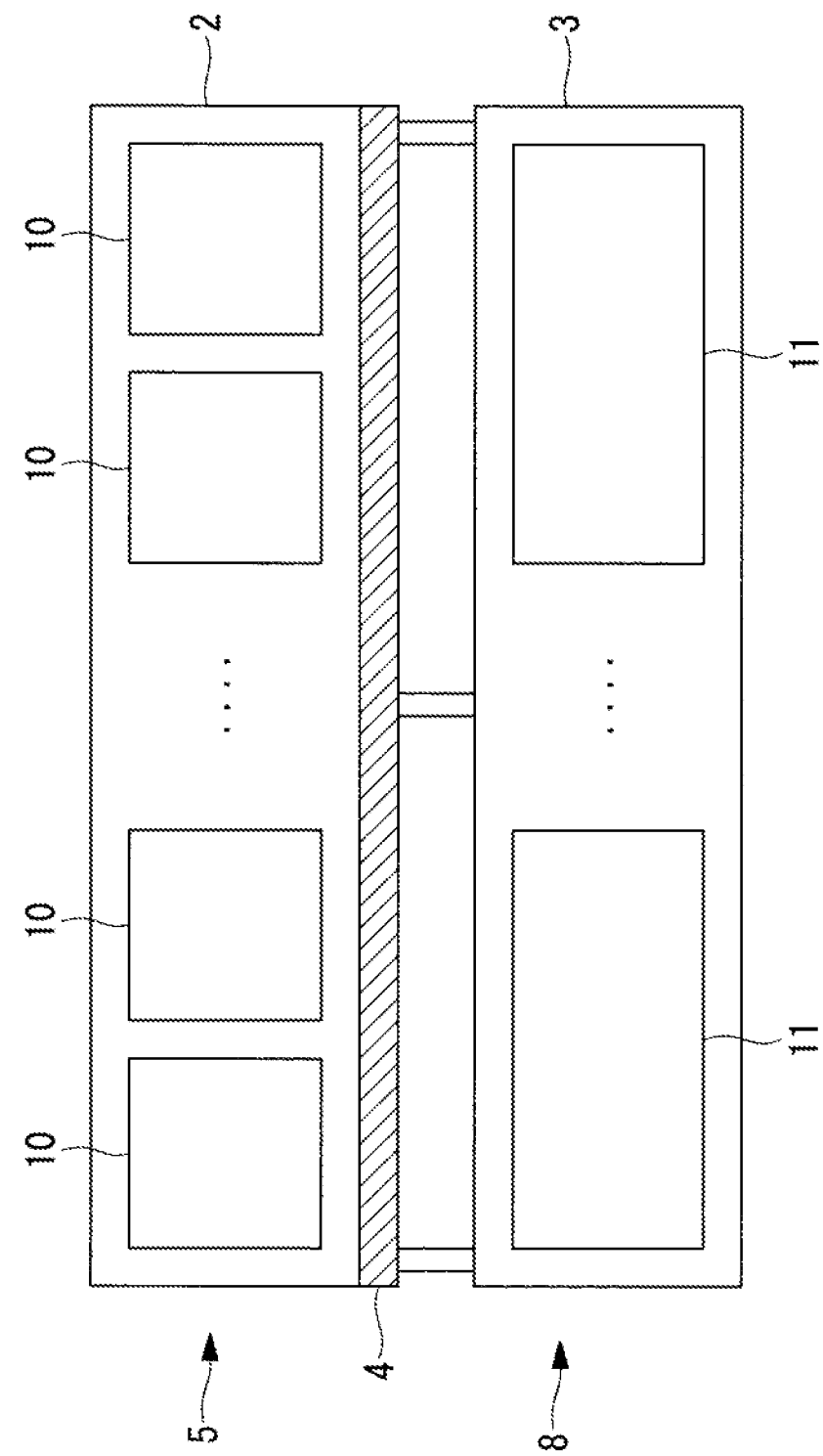
FIG. 10 is a cross-sectional view showing an eighth modification of the image-acquisition device in FIG. 1.

In this embodiment, the photodiodes 10 forming the pixels 2a in the photoelectric conversion film 5 of the first image-acquisition surface 2 and the photodiodes 11 forming the pixels 3a in the photoelectric conversion layer 8 of the second image-acquisition surface 3 have the same size and are arranged at the same pitch; instead, as shown in FIG. 10, one photodiode 11 in the second image-acquisition surface 3 may be assigned to two photodiodes 10 arranged one-dimensionally in the photoelectric conversion film 5 of the first image-acquisition surface 2, that is, to four photodiodes 10 arranged two-dimensionally in the photoelectric conversion film 5 of the first image-acquisition surface 2.

This improves the light reception sensitivity of the second image-acquisition surface 3.

Figure 11:
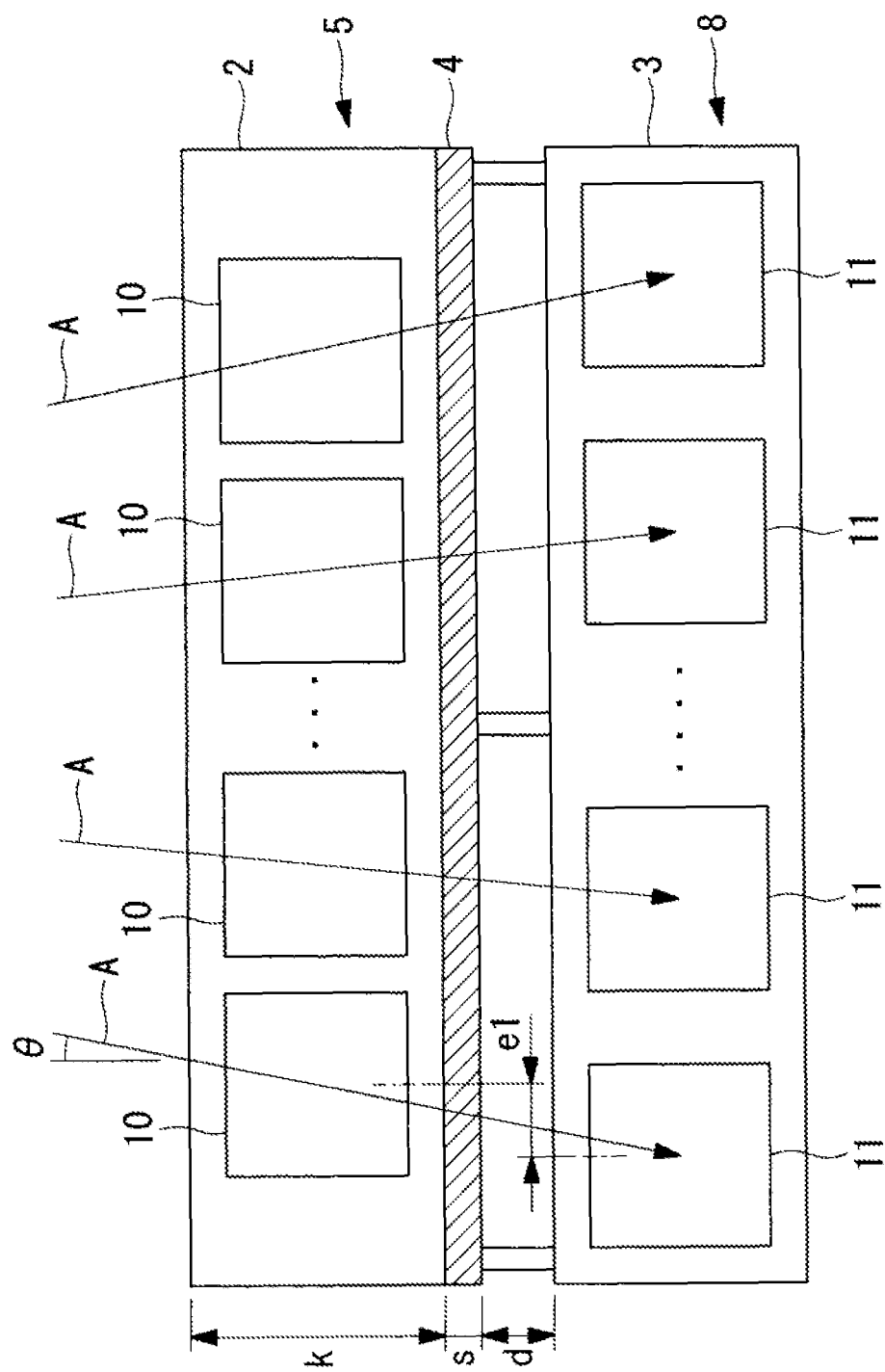
FIG. 11 is a cross-sectional view showing a ninth modification of the image-acquisition device in FIG. 1.

The angle of the incident light A entering the image-acquisition device 1 may vary depending on the position where the incident light A is incident in the first image-acquisition surface 2 because of the characteristics of the optical system disposed in front of the image-acquisition device 1. As shown in FIG. 11, if the angle θ of the incident light A is not perpendicular to the first image-acquisition surface 2, the photodiodes 11 in the second image-acquisition surface 3 may be shifted from the photodiodes 10 in the first image-acquisition surface 2 by taking into account the angle θ to improve the light reception efficiency of the photodiodes 11 in the second image-acquisition surface 3.

Specifically, the incident light A is incident substantially perpendicularly on the first image-acquisition surface 2 near the center of the first image-acquisition surface 2; therefore, the photodiodes 11 in the second image-acquisition surface 3 are arranged at the same pitch as the photodiodes 10 in the first image-acquisition surface 2. The incident light A, however, is incident at a non-perpendicular angle θ to the first image-acquisition surface 2 near the periphery of the first image-acquisition surface 2; therefore, the photodiodes 11 in the second image-acquisition surface 3 are arranged at a larger pitch.

The amount of shift e1 between the center of the photodiodes 10 in the first image-acquisition surface 2 and the center of the photodiodes 11 in the second image-acquisition surface 3 is calculated by the following equation based on the characteristics of the optical system and the distance between the two image-acquisition surfaces 2 and 3.

$$e1 = (k+s+d)\tan(\theta(x,y))$$

Here k is the thickness of the first image-acquisition surface 2, s is the thickness of the polarizing filter 4, d is the distance between the two image-acquisition surfaces 2 and 3, and θ(x,y) is the angle of incidence at the coordinates (x,y) in the first image-acquisition surface 2.

Although the Bayer pattern of the red color filter elements 6a, the green color filter elements 6b, and the blue color filter elements 6c is used as an example of a color filter in this embodiment to acquire RGB color mode information, it does not necessarily have to be used; instead, other color filters may be used to acquire CMYK color mode information.

Next, an image-acquisition apparatus 20 according to a second embodiment of the present invention will be described below with reference to the drawings.

Figure 12:
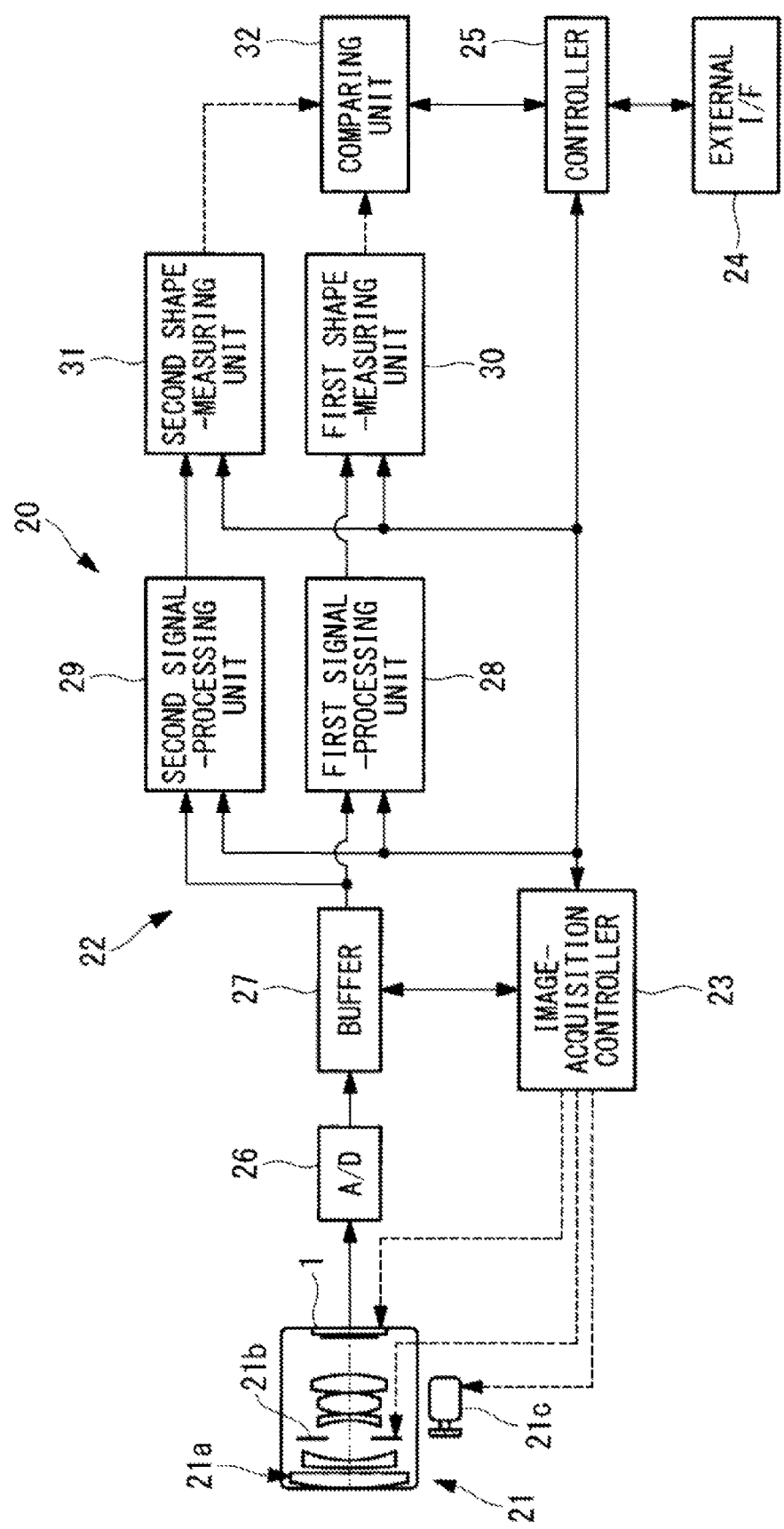
FIG. 12 is an overall block diagram showing an image-acquisition device according to a second embodiment of the present invention.

As shown in FIG. 12, the image-acquisition apparatus 20 according to this embodiment includes the image-acquisition device 1 having any of the above configurations according to the first embodiment, which serves as a sensor (hereinafter referred to as "sensor 1"), and also includes an optical system 21 disposed in front of the sensor 1, an image processor 22 that processes outputs from the sensor 1, an image-acquisition controller 23 that controls the optical system 21 and the sensor 1 based on image signals acquired by the sensor 1, an external interface (I/F) 24 that is manipulated by an operator, and a controller 25 that controls the image processor 22 and the image-acquisition controller 23 based on inputs from the external I/F 24.

In the description of this embodiment, the sensor is described as having the configuration in FIG. 1.

The optical system 21 includes a lens system 21a, a diaphragm 21b, and an AF motor 21c that actuates the lens system 21a.

The image processor 22 includes an A/D converter 26 that converts image signals acquired by the sensor 1 into digital signals, a buffer 27 that stores the image signals converted by the A/D converter 26, first and second signal-processing units 28 and 29 that separately retrieve and process the image signals acquired by the first and second image-acquisition surfaces 2 and 3, respectively, from the buffer 27, first and second shape-measuring units 30 and 31 that separately measure the shape of the subject from the image signals processed by the first and second signal-processing units 28 and 29, respectively, and a comparing unit 32 that compares the shapes measured by the two shape-measuring units 30 and 31.

The first signal-processing unit 28 retrieves the image signals acquired by the first image-acquisition surface 2 from the buffer 27 and executes known demosaicing and white balance processing to generate three-channel RGB image signals for each pixel 2a.

The second signal-processing unit 29 retrieves the image signals acquired by the second image-acquisition surface 3 from the buffer 27 and executes known bilinear or bicubic interpolation to generate polarization information for four directions for each pixel 3a. That is, the second signal-processing unit 29 generates four-channel image signals.

The first shape-measuring unit 30 calculates a normal vector serving as shape information for the subject for each pixel 2a from the RGB image signals received from the first signal-processing unit 28 using a known shape-from-shading technique.

The second shape-measuring unit 31 calculates a parameter associated with polarization from the polarization information for four directions received from the second signal-processing unit 29.

Figure 13:
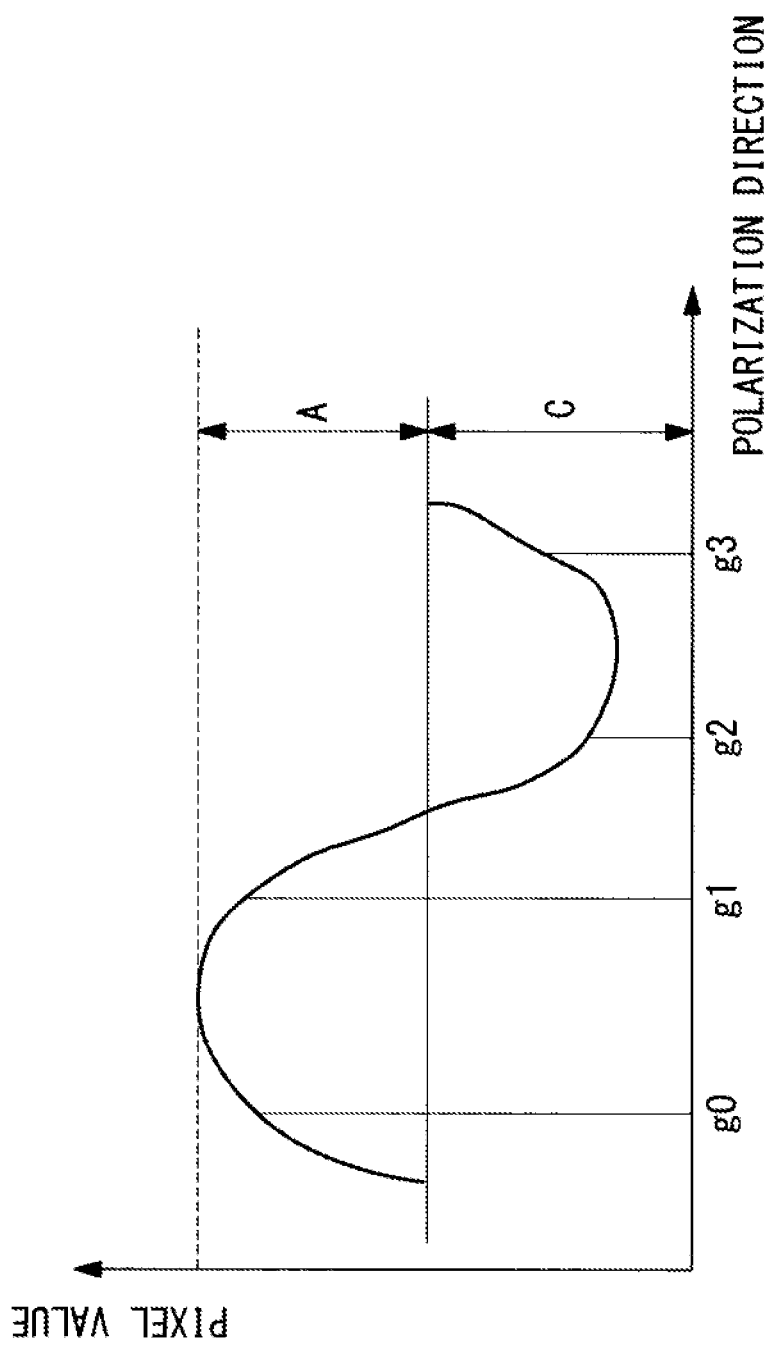
FIG. 13 is a graph showing the relationship between polarization direction and pixel value.

FIG. 13 shows the relationship between the polarization intensity and the main polarization direction. The polarization intensity is generally expressed by the following equation:

$$g_i = A(\cos((\pi/2)i + 2\phi)) + C$$

Here $g_i$ is the signal representing the polarization information (where i=0 to 3); A is the amplitude; C is the average polarization intensity; and $\phi$ is the direction in which the polarization intensity is maximized.

A, C, and $\phi$ in the above equation can be calculated by taking the Fourier transform of the polarization information for four directions for each pixel 3a of the second image-acquisition surface 3.

The main polarization direction $\phi$ is perpendicular to the normal vector of the subject; therefore, the normal vector of the subject can be calculated by calculating the main polarization direction $\phi$.

The comparing unit 32 compares the normal vectors received from the first and second shape-measuring units 30 and 31. The normal vector in the first image-acquisition surface 2 is n1(x,y), whereas the normal vector in the second image-acquisition surface 3 is n2(x,y). If the normal vectors satisfy the following inequality, the final normal vector n is n(x,y)=n1(x,y) or n(x,y)=n2(x,y); if the normal vectors do not satisfy the following inequality, a zero vector is given.

$$n2(x,y) - \epsilon < n1(x,y) < n2(x,y) + \epsilon$$

Here $\epsilon$ is an extremely small constant vector.

This procedure gives only reliable normal vectors and thus allows the shape of the subject to be measured with high accuracy.

The normal vector of a region where a zero vector is given may be estimated by interpolating the information for known normal vectors around that region.

In this embodiment, A, C, and $\phi$ in the above equation are calculated from the polarization information for four directions; however, it is only necessary to acquire polarization information for at least three directions since there are three unknown parameters. Therefore, shape information can also be acquired using, as a sensor, an image-acquisition device 1 having three types of polarizing filter elements, as shown in FIGS. 8 and 9.

As described above, according to this embodiment, when incident light coming from the subject enters the first image-acquisition surface, some of the incident light is subjected to photoelectric conversion in the photoelectric conversion film to acquire an image signal, whereas the other incident light is transmitted by the photoelectric conversion film. The transmitted incident light passes through the polarizing filter, where polarization information is extracted, before the incident light enters the photoelectric conversion layer of the second image-acquisition surface. In this way, an image signal containing polarization information is acquired.

In this case, the polarization information is acquired in the second image-acquisition surface, which is different from the first image-acquisition surface, after the incident light passes through the first image-acquisition surface; therefore, complete color information can be acquired in the first image-acquisition surface. Thus, polarization information and color information can be simultaneously acquired without decreasing the resolution of the color information.

As described above, the polarizing filter may be disposed at positions where incident light that will enter some pixels of the second image-acquisition surface passes through.

This allows polarization information to be acquired in some pixels of the second image-acquisition surface and color information to be acquired in other pixels, thus further improving the resolution of the color information.

As described above, a white filter may be disposed at positions where incident light that will enter other pixels of the second image-acquisition surface passes through.

This increases the intensity of the light entering the second image-acquisition surface through the white filter, thus improving the sensitivity.

As described above, the image-acquisition device may further include, in front of the first image-acquisition surface, a color filter that transmits the incident light, and the color filter may include, for each minimum pixel area including a two-by-two array of four pixels in the first image-acquisition surface, one red color filter element, two green color filter elements, and one blue color filter element at positions where incident light that will enter the pixels passes through.

This allows complete color information for red, green, and blue to be acquired in each minimum pixel area including a two-by-two array of four pixels in the first image-acquisition surface.

As described above, the image-acquisition device may further include, in front of the first image-acquisition surface, a color filter that transmits the incident light, and the color filter may include, for each minimum pixel area including a two-by-two array of four pixels in the first image-acquisition surface, one red color filter element, one green color filter element, one blue color filter element, and one white color filter element at positions where incident light that will enter the pixels passes through.

This allows complete color information for red, green, and blue to be acquired in each minimum pixel area including a two-by-two array of four pixels in the first image-acquisition surface. In addition, the incident light passing through the pixels corresponding to the white color filter elements has a higher intensity than the incident light passing through the pixels corresponding to the other color filter elements, which allows polarization information to be acquired with high sensitivity in the second image-acquisition surface.

As described above, the polarizing filter may include, for each minimum pixel area including a two-by-two array of four pixels in the second image-acquisition surface, four polarizing filter elements having different polarization directions at positions where incident light that will enter the pixels passes through.

This allows polarization information for different polarization directions to be acquired in the individual pixels of the second image-acquisition surface, thus improving the resolution of the polarization information.

As described above, the polarizing filter may include, for each minimum pixel area including a two-by-two array of four pixels in the second image-acquisition surface, three polarizing filter elements having different polarization directions and one white color filter element at positions where incident light that will enter the pixels passes through.

This allows, for example, near-infrared light to be received in the pixels of the second image-acquisition surface corresponding to the white color filter elements, which transmit all incident light passing through the corresponding pixels of the first image-acquisition surface.

As described above, the polarizing filter may include, for each pixel area group including an array of four minimum pixel areas including a two-by-two array of four pixels in the second image-acquisition surface, four polarizing filter elements having different polarization directions at positions where incident light that will enter any one pixel of each minimum pixel area passes through.

This allows polarization information for four different polarization directions to be acquired in the second image-acquisition surface and color information to be acquired at the positions corresponding to the other pixels, thus improving the resolution of the color information.

As described above, the polarizing filter may include, for each pixel area group including an array of four minimum pixel areas including a two-by-two array of four pixels in the second image-acquisition surface, three polarizing filter elements having different polarization directions and one white color filter element at positions where incident light that will enter any one pixel of each minimum pixel area passes through and color filter elements having different wavelength ranges at positions where incident light that will enter the other three pixels of each minimum pixel area passes through.

This allows polarization information for three different polarization directions to be acquired in the second image-acquisition surface to obtain the minimum polarization information required to determine the three-dimensional shape of the subject. In addition, for example, near-infrared light can be detected in the pixels corresponding to the white color filter elements, whereas color information for improving the resolution of a color image can be acquired in the pixels corresponding to the other color filter elements.

As described above, the polarizing filter may include, for each pixel area group including an array of four minimum pixel areas including a two-by-two array of four pixels in the second image-acquisition surface, four polarizing filter elements having different polarization directions at positions where incident light that will enter all pixels of each minimum pixel area passes through.

This allows polarization information for the same direction to be extracted from the incident light passing through each color filter element. Thus, polarization information for determining the three-dimensional shape of the subject can be acquired even if any particular color is predominant in the subject.

As described above, the polarizing filter may include, for each pixel area group including an array of four minimum pixel areas including a two-by-two array of four pixels in the second image-acquisition surface, three polarizing filter elements having different polarization directions and one white color filter element at positions where incident light that will enter all pixels of each minimum pixel area passes through.

This allows polarization information for three different polarization directions to be acquired in the second image-acquisition surface to obtain the minimum polarization information required to determine the three-dimensional shape of the subject even if any particular color is predominant in the subject. In addition, for example, near-infrared light can be detected in the pixels corresponding to the white color filter elements, whereas color information for improving the resolution of a color image can be acquired in the pixels corresponding to the other color filter elements.

As described above, the polarizing filter may have a near-infrared transmission wavelength range, and the photoelectric conversion layer of the second image-acquisition surface may be sensitive to near-infrared light.

This allows image information for near-infrared light to be acquired in the second image-acquisition surface.

As described above, the second image-acquisition surface may have pixels arranged at a pitch depending on an angle of incidence of the incident light passing through the first image-acquisition surface.

This allows the pixels of the first image-acquisition surface and the pixels of the second image-acquisition surface to be readily associated with each other.

As described above, the second image-acquisition surface may have larger pixels than the first image-acquisition surface.

This improves the sensitivity of the second image-acquisition surface and also improves the light reception sensitivity of the second image-acquisition surface if the incident light is not incident perpendicularly on the image-acquisition surface.

As described above, the image-acquisition device may further include a first shape-measuring unit that executes a first shape measurement using shading information contained in a first image signal acquired in the first image-acquisition surface; a second shape-measuring unit that executes a second shape measurement using polarization information contained in a second image signal acquired in the second image-acquisition surface; and a comparing unit that compares results of the shape measurements for the first and second image signals at the same coordinates.

This allows the first shape measurement to be executed by the first shape-measuring unit based on the shading information contained in the first image signal acquired in the first image-acquisition surface and allows the second shape measurement to be executed by the second shape-measuring unit based on the polarization information contained in the second image signal acquired in the second image-acquisition surface. The results of the two shape measurements can then be compared in the comparing unit to measure the shape of the subject with high accuracy.

The invention claimed is:

1. An image-acquisition device comprising:
a first image-acquisition surface including a photoelectric conversion film capable of subjecting incident light to photoelectric conversion while transmitting some of the incident light;
a second image-acquisition surface including a photoelectric conversion layer that subjects the incident light transmitted by the first image-acquisition surface to photoelectric conversion; and
a polarizing filter that is disposed between the two image-acquisition surfaces and that extracts polarization information from the incident light transmitted by the first image-acquisition surface.

2. The image-acquisition device according to claim 1, wherein the polarizing filter is disposed at positions where incident light that will enter some pixels of the second image-acquisition surface passes through.

3. The image-acquisition device according to claim 2, wherein a white filter is disposed at positions where incident light that will enter other pixels of the second image-acquisition surface passes through.

4. The image-acquisition device according to claim 1, further comprising, in front of the first image-acquisition surface, a color filter that transmits the incident light,
wherein the color filter includes, for each minimum pixel area including a two-by-two array of four pixels in the first image-acquisition surface, one red color filter element, two green color filter elements, and one blue color filter element at positions where incident light that will enter the pixels passes through.

5. The image-acquisition device according to claim 1, further comprising, in front of the first image-acquisition surface, a color filter that transmits the incident light,
wherein the color filter includes, for each minimum pixel area including a two-by-two array of four pixels in the first image-acquisition surface, one red color filter element, one green color filter element, one blue color filter element, and one white color filter element at positions where incident light that will enter the pixels passes through.

6. The image-acquisition device according to claim 4, wherein the polarizing filter includes, for each minimum pixel area including a two-by-two array of four pixels in the second image-acquisition surface, four polarizing filter elements having different polarization directions at positions where incident light that will enter the pixels passes through.

7. The image-acquisition device according to claim 4, wherein the polarizing filter includes, for each minimum pixel area including a two-by-two array of four pixels in the second image-acquisition surface, three polarizing filter elements having different polarization directions and one white color filter element at positions where incident light that will enter the pixels passes through.

8. The image-acquisition device according to claim 4, wherein the polarizing filter includes, for each pixel area group including an array of four minimum pixel areas including a two-by-two array of four pixels in the second image-acquisition surface, four polarizing filter elements having different polarization directions at positions where incident light that will enter any one pixel of each minimum pixel area passes through.

9. The image-acquisition device according to claim 4, wherein the polarizing filter includes, for each pixel area group including an array of four minimum pixel areas including a two-by-two array of four pixels in the second image-acquisition surface, three polarizing filter elements having different polarization directions and one white color filter element at positions where incident light that will enter any one pixel of each minimum pixel area passes through and color filter elements having different wavelength ranges at positions where incident light that will enter the other three pixels of each minimum pixel area passes through.

10. The image-acquisition device according to claim 4, wherein the polarizing filter includes, for each pixel area group including an array of four minimum pixel areas including a two-by-two array of four pixels in the second image-acquisition surface, four polarizing filter elements having different polarization directions at positions where incident light that will enter all pixels of each minimum pixel area passes through.

11. The image-acquisition device according to claim 4, wherein the polarizing filter includes, for each pixel area group including an array of four minimum pixel areas including a two-by-two array of four pixels in the second image-acquisition surface, three polarizing filter elements having different polarization directions and one white color filter element at positions where incident light that will enter all pixels of each minimum pixel area passes through.

12. The image-acquisition device according to claim 1, wherein
the polarizing filter has a near-infrared transmission wavelength range, and
the photoelectric conversion layer of the second image-acquisition surface is sensitive to near-infrared light.

13. The image-acquisition device according to claim 1, wherein the second image-acquisition surface has pixels arranged at a pitch depending on an angle of incidence of the incident light passing through the first image-acquisition surface.

14. The image-acquisition device according to claim 13, wherein the second image-acquisition surface has larger pixels than the first image-acquisition surface.

15. The image-acquisition device according to claim 1, further comprising:
a first shape-measuring unit that executes a first shape measurement using shading information contained in a first image signal acquired in the first image-acquisition surface;
a second shape-measuring unit that executes a second shape measurement using polarization information contained in a second image signal acquired in the second image-acquisition surface; and
a comparing unit that compares results of the shape measurements for the first and second image signals at the same coordinates.

16. The image-acquisition device according to claim 5, wherein the polarizing filter includes, for each minimum pixel area including a two-by-two array of four pixels in the second image-acquisition surface, four polarizing filter elements having different polarization directions at positions where incident light that will enter the pixels passes through.

17. The image-acquisition device according to claim 5, wherein the polarizing filter includes, for each minimum pixel area including a two-by-two array of four pixels in the second image-acquisition surface, three polarizing filter elements having different polarization directions and one white color filter element at positions where incident light that will enter the pixels passes through.

18. The image-acquisition device according to claim 5, wherein the polarizing filter includes, for each pixel area group including an array of four minimum pixel areas including a two-by-two array of four pixels in the second image-acquisition surface, four polarizing filter elements having different polarization directions at positions where incident light that will enter any one pixel of each minimum pixel area passes through.

19. The image-acquisition device according to claim 5, wherein the polarizing filter includes, for each pixel area group including an array of four minimum pixel areas including a two-by-two array of four pixels in the second image-acquisition surface, three polarizing filter elements having different polarization directions and one white color filter element at positions where incident light that will enter any one pixel of each minimum pixel area passes through and color filter elements having different wavelength ranges at positions where incident light that will enter the other three pixels of each minimum pixel area passes through.

20. The image-acquisition device according to claim 5, wherein the polarizing filter includes, for each pixel area group including an array of four minimum pixel areas including a two-by-two array of four pixels in the second image-acquisition surface, four polarizing filter elements having different polarization directions at positions where incident light that will enter all pixels of each minimum pixel area passes through.

21. The image-acquisition device according to claim 5, wherein the polarizing filter includes, for each pixel area group including an array of four minimum pixel areas including a two-by-two array of four pixels in the second image-acquisition surface, three polarizing filter elements having different polarization directions and one white color filter element at positions where incident light that will enter all pixels of each minimum pixel area passes through.

\* \* \* \* \*